(12) United States Patent
Alexandru

(10) Patent No.: US 8,452,828 B1
(45) Date of Patent: May 28, 2013

(54) METHOD AND APPARATUS FOR IMPLEMENTING FINITE IMPULSE RESPONSE FILTERS WITHOUT THE USE OF MULTIPLIERS

(75) Inventor: Radu Alexandru, Wallingford, CT (US)

(73) Assignee: Hitachi Aloka Medical, Ltd., Tokyo (JP)

( * ) Notice: Subject to any disclaimer, the term of this patent is extended or adjusted under 35 U.S.C. 154(b) by 270 days.

(21) Appl. No.: 13/032,924

(22) Filed: Feb. 23, 2011

Related U.S. Application Data

(62) Division of application No. 11/633,875, filed on Dec. 4, 2006, now Pat. No. 7,912,884.

(51) Int. Cl.
 *G06F 17/10* (2006.01)
(52) U.S. Cl.
 USPC .......................................... 708/319
(58) Field of Classification Search
 USPC .......................................... 708/319
 See application file for complete search history.

(56) References Cited

U.S. PATENT DOCUMENTS

| | | | |
|---|---|---|---|
| 4,736,448 A | | 4/1988 | Umemura |
| 5,873,054 A | * | 2/1999 | Warburton et al. ........... 702/190 |
| 2005/0001673 A1 | * | 1/2005 | Regev ........................... 329/315 |
| 2005/0271120 A1 | | 12/2005 | Hoctor |
| 2005/0276340 A1 | * | 12/2005 | Chow et al. ................... 375/260 |
| 2008/0133625 A1 | | 6/2008 | Alexandru |

* cited by examiner

*Primary Examiner* — Chuong D Ngo
(74) *Attorney, Agent, or Firm* — Buckley, Maschoff & Talwalkar LLC

(57) ABSTRACT

A finite impulse response filter is implemented as a sum of individual component, running-sum filters. The sum of all of the component filters required for a desired filter response is calculated in an accumulator and only the component filters' update terms, which are the difference between a new and an old discarded sample, is calculated for each component filter. A desired impulse response is decomposed into a sum of rectangular impulse responses of equal height, each of which implemented as a running sum requiring a subtraction and an addition. Using circuits running at a multiple of the sampling clock, multiple running sums may be implemented on the same hardware. A whole filter of arbitrary impulse response shapes and lengths may be implemented using memory and two arithmetic units. Two or more such filters may be cascaded to obtain a better approximation of the desired frequency characteristic. The invention saves significant chip resources and manufacturing costs.

15 Claims, 6 Drawing Sheets

METHOD AND APPARATUS FOR IMPLEMENTING FINITE IMPULSE RESPONSE FILTERS WITHOUT THE USE OF MULTIPLIERS

CROSS-REFERENCE TO RELATED APPLICATION

This is a divisional of U.S. patent application Ser. No. 11/633,875, filed Dec. 4, 2006, now U.S. Pat. No. 7,921,884.

BACKGROUND OF THE INVENTION

The invention relates generally to the field of digital signal processing. More specifically, embodiments of the invention relate to methods and systems for implementing finite impulse response filters without using multipliers.

Filtering is one of the most often used operations in digital signal processing. One method of filtering is by means of a finite impulse response (FIR) filter. In this type of filter, an input signal is convolved with an impulse response of finite duration that determines the frequency response output characteristics. Since an FIR is typically used in a sampled data system, the signal and the impulse response are quantized in time and amplitude yielding discrete samples. The discrete samples comprising the desired impulse response are the FIR filter coefficients.

The FIR filter calculation for each output sample is a two step process. A number of input signal samples are multiplied by a corresponding number of coefficient values (the values for each pair are multiplied together). Afterwards, all of the products are added together. The number and values of coefficients correspond with a desired frequency response. The longer the impulse response, the more filter coefficients and therefore the more multiplications are needed.

One disadvantage of FIR filters is the computational complexity required for each output sample. For example, for each output sample, N multiply-accumulate (MAC) operations need be performed. A 100 coefficient filter requires 100 multiplications and 100 additions for each output sample.

Digital signal processing (DSP) integrated circuits are specialized computational engines designed to simultaneously move sampled data from tap to tap while computing very large numbers of multiplications and additions. Despite many schemes for increased computational efficiency, a compromise between desired filter response and the number of taps is not uncommon. The tradeoff is between attenuation, flat response, ripple in the passband and attenuation region, transition bands and more. Other compromises have to do with computational accuracy. The number of bits available for both coefficients and input signal samples affect filter quality. The filter designer must take all of the above factors into consideration.

Despite the advances made in fabricating integrated circuits that reduce cost and the amount of chip area needed to implement multipliers, a multiplier remains relatively expensive when compared to other arithmetic operations such as adders. The expense is directly related to logic gate count. Binary adders are less costly than binary multipliers, however their use should be minimized as well. If the goal of a filter designer is to minimize cost and to conserve IC resources when implementing multichannel designs, it is desirable to find filtering architectures and methods which minimize, or obviate multipliers.

There are methods that reduce the number of multipliers used in filter implementations. For example, taking advantage of the symmetrical properties of filter coefficient impulse responses. However, the reduction is typically by a factor of 2 and in many applications is insufficient. Methods are also known that simplify the multipliers by choosing coefficients which are powers of 2, or sums of a small number of powers of 2. The simplification in this case is also insufficient since this type of filter usually requires a second filter to improve the frequency response. Most methods that reduce the number of multipliers in their calculations perform poorly and their flexibility is limited.

There is a need for low-cost FIR filters with improved performance and flexibility for applications such as filtering input signals in the front-end of ultrasound systems, where cost and chip resources are a consideration.

SUMMARY OF THE INVENTION

Although there are various methods and systems that implement FIR filters without multipliers, such methods and systems are not completely satisfactory. The inventor has discovered a method and system that implements a finite impulse response filter as a sum of individual component, running-sum filters. The sum of all of the component filters required for a desired filter response is calculated in an accumulator and only the component filters' update terms, which are the difference between a new and an old discarded sample, is calculated for each component filter. The invention saves significant chip resources and manufacturing costs.

A desired impulse response is decomposed into a sum of rectangular impulse responses of equal height, each of which implemented as a running sum requiring a subtraction and an addition. Using circuits running at a multiple of the sampling clock, multiple running sums may be implemented on the same hardware. A whole filter of arbitrary impulse response shapes and lengths may be implemented using memory and two arithmetic units. Two or more such filters may be cascaded to obtain a better approximation of the desired frequency characteristic.

One aspect of the invention provides methods for filtering a signal using a desired impulse response. Methods according to this aspect of the invention preferably start with decomposing the desired impulse response into a plurality of individual rectangular component impulse responses, inputting the signal to each one of the plurality of rectangular component impulse responses, convolving each one of the plurality of rectangular component impulse responses with the input signal, and summing the plurality of convolutions, wherein the sum is the response of the desired impulse response to the input signal.

Another aspect of the method is wherein convolving includes using a running sum.

Yet another aspect of the method is where decomposing includes calculating a frequency response for the desired impulse response, specifying a quantity of component rectangular impulse responses, decomposing the desired impulse response into a candidate response, the candidate response comprises the quantity of component rectangular impulse responses such that each component rectangular impulse response has either a positive or negative amplitude and when summed together approximate the desired impulse response, refining the candidate impulse response iteratively comprising a) calculating a frequency response for the candidate response, and b) comparing the candidate frequency response with the desired frequency response, wherein if the candidate frequency response is within the predefined range, use the candidate response, and if the candidate frequency response is not within a predefined range, adjust one or more of the candidate response component rectangular impulse response lengths, repeating steps a) and b)).

Another aspect of the invention is a digital filter. Digital filters according to this aspect of the invention comprise a filter input for inputting signal samples, a filter output for outputting a filtered sampled signal, a first delay coupled to the filter input for delaying a number of samples corresponding to a number of samples preceding a rectangular impulse response, a second delay coupled to an output of the first delay for delaying a number of samples corresponding to a number of samples representing the rectangular impulse response, a subtractor coupled to the output of the first delay and an output of the second delay for obtaining the difference between incoming signal samples and signal samples time-shifted by the amount corresponding to the rectangular impulse response, and an accumulator input coupled to an output of the subtractor for keeping a running sum of the difference samples as the filter output.

Yet another aspect of the invention is a digital filter that comprises a filter input for inputting signal samples, a filter output for outputting a filtered sampled signal, a buffer coupled to the filter input, the buffer acting as a queue, a register having an input coupled to a first data output of the buffer, a subtractor having a minus input coupled to an output of the register and a plus input coupled to a second data output of the buffer for obtaining differences between a plurality of time-shifted signal samples and a second plurality of time-shifted signal samples output from the buffer, wherein each pair of samples of the first and second plurality of time-shifted samples output from the buffer represents a rectangular impulse response such that the incoming data sample is convolved with each of the plurality of rectangular impulse responses in time, an accumulator input coupled to an output of the subtractor for keeping a running sum of the plurality of differences, and an output coupled to the filter output, and a controller coupled to the buffer and accumulator, the controller configured to rotate through the buffer for addresses where a next incoming signal sample will be written to and where a previously written signal sample will be read from, and controls whether a difference is added to or subtracted from the running sum.

The details of one or more embodiments of the invention are set forth in the accompanying drawings and the description below. Other features, objects, and advantages of the invention will be apparent from the description and drawings, and from the claims.

DETAILED DESCRIPTION

Embodiments of the invention will be described with reference to the accompanying drawing figures wherein like numbers represent like elements throughout. Further, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. The terms "mounted," "connected," and "coupled" are used broadly and encompass both direct and indirect mounting, connecting, and coupling. Further, "connected" and "coupled" are not restricted to physical or mechanical connections or couplings.

It should also be understood that some components and items are illustrated and described as if they were hardware elements, as is common practice within the art. However, one of ordinary skill in the art, and based on a reading of this detailed description, would understand that, in at least one embodiment, components in the method and system may be implemented in software or hardware.

Embodiments of the invention provide methods and systems for implementing a FIR filter structure that does not require multipliers.

By way of background, if s[n] is an input signal sampled in discrete time having N samples running from 0 to N−1, and h[n] is an M sample signal having 0 to M−1 samples that define the FIR filter coefficients (impulse response), the convolution of the two o[n] is an N+M−1 sample signal running from 0 to N+M−2 given by, $$o[n] = s[n] \otimes h[n] = \sum_{k=0}^{M-1} s[n-k]h[k], \quad (1)$$

that defines the convolution sum.

Figure 1:
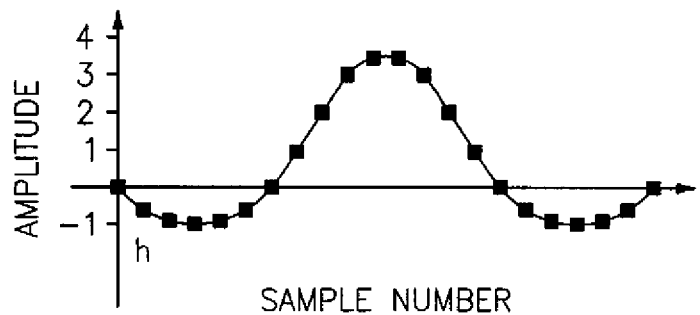
FIG. 1 shows an exemplary plot of a filter impulse response.
Figure 2A:
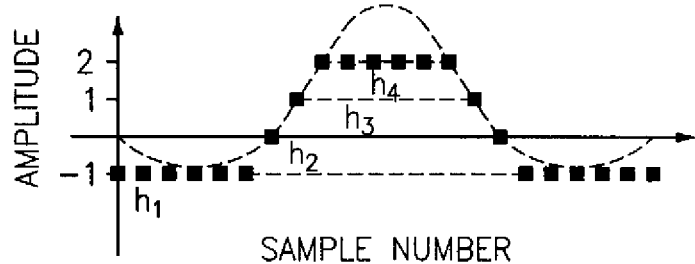
FIGS. 2A, 2B and 2C show an exemplary decomposition of the filter impulse response shown in FIG. 1 into component impulse responses $h_1$, $h_2$, $h_3$ and $h_4$.

FIG. 1 shows an exemplary desired filter impulse response, or filter kernel, symmetrical with respect to its center and comprising a positive center lobe and side-lobes of smaller amplitude. Only one pair of negative side-lobes is shown. The impulse response may be approximated by a sum of positive and negative rectangular components, as shown in FIG. 2A given by, $$h[n] = \sum_{i=1}^{I} h_i[n], \quad (2)$$

where i=1, 2, 3, ..., I. The number of rectangular components I equals 4 ($h_1$, $h_2$, $h_3$, and $h_4$), but may be any value equal to or larger than 1. A desired filter impulse response does not have to be symmetric.

Figure 2B:
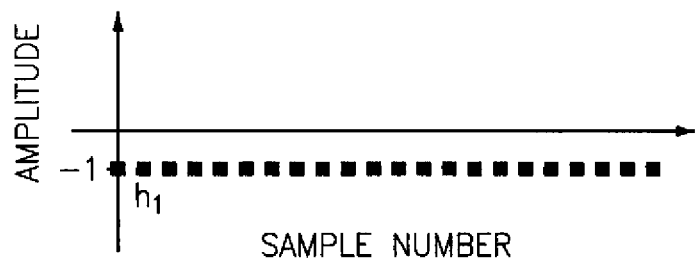
Figure 2C:
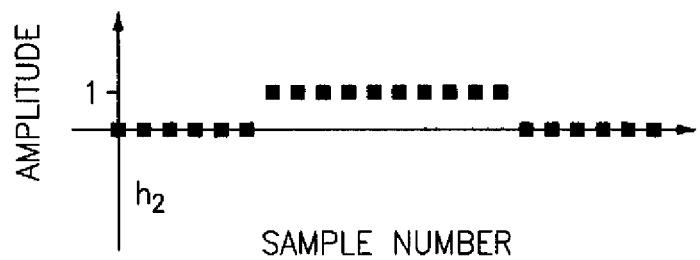

Each rectangular component kernel $h_1$, $h_2$, $h_3$, and $h_4$ is defined by a discrete number of ±non-zero coefficients (or samples). Zero values are added to either side of a rectangular response to equal the duration of the component kernel having the greater number of non-zero coefficients for proper time-alignment. For example, the rectangular filter component $h_1$, shown in FIG. 2B, comprises 22 non-zero negative (−1) coefficients. For proper time-alignment, the rectangular filter component $h_2$, shown in FIG. 2C, comprises 10 positive (+1) coefficients and must have 6 zero coefficients before the 10 positive coefficients. Accordingly, the rectangular filter component $h_3$, shown in FIG. 2A, comprises eight positive coefficients and must have seven zero coefficients placed before its non-zero amplitudes. The rectangular filter component $h_4$ comprises six positive coefficients and has eight zero coefficients placed before its non-zero amplitudes.

The component filters $h_1$, $h_2$, $h_3$, and $h_4$ have amplitudes of either ±1 and do not require multipliers. Other component filter amplitudes may be used resulting in a better approximation and precision. However, operational complexity increases. Precise amplitudes would require a multiplier and a coefficient store to scale the amplitude of each component filter. A rougher scaling may be performed using a scaling multiplexer using powers of 2 ($2^x$, where x=0, 1, 2, . . . ). This aspect of the invention will be discussed below.

To combine and form a single impulse response from component impulse responses, each component impulse response has the same duration (number of coefficients) and the same unity magnitude, but with differing signs for their non-zero coefficients. The number and position of the non-zero coefficients may vary from component to component as described above.

The decomposition of a desired filter impulse response or kernel into component rectangular filters is an optimization between implementation expense, operational efficiency, and desired filter frequency response accuracy. The greater the number of rectangular filter components i in (2) used in the impulse response approximation, the greater the implementation expense. In contrast, the fewer the rectangular components used, the poorer the impulse response approximation, and consequently, the associated frequency response.

Figure 3:
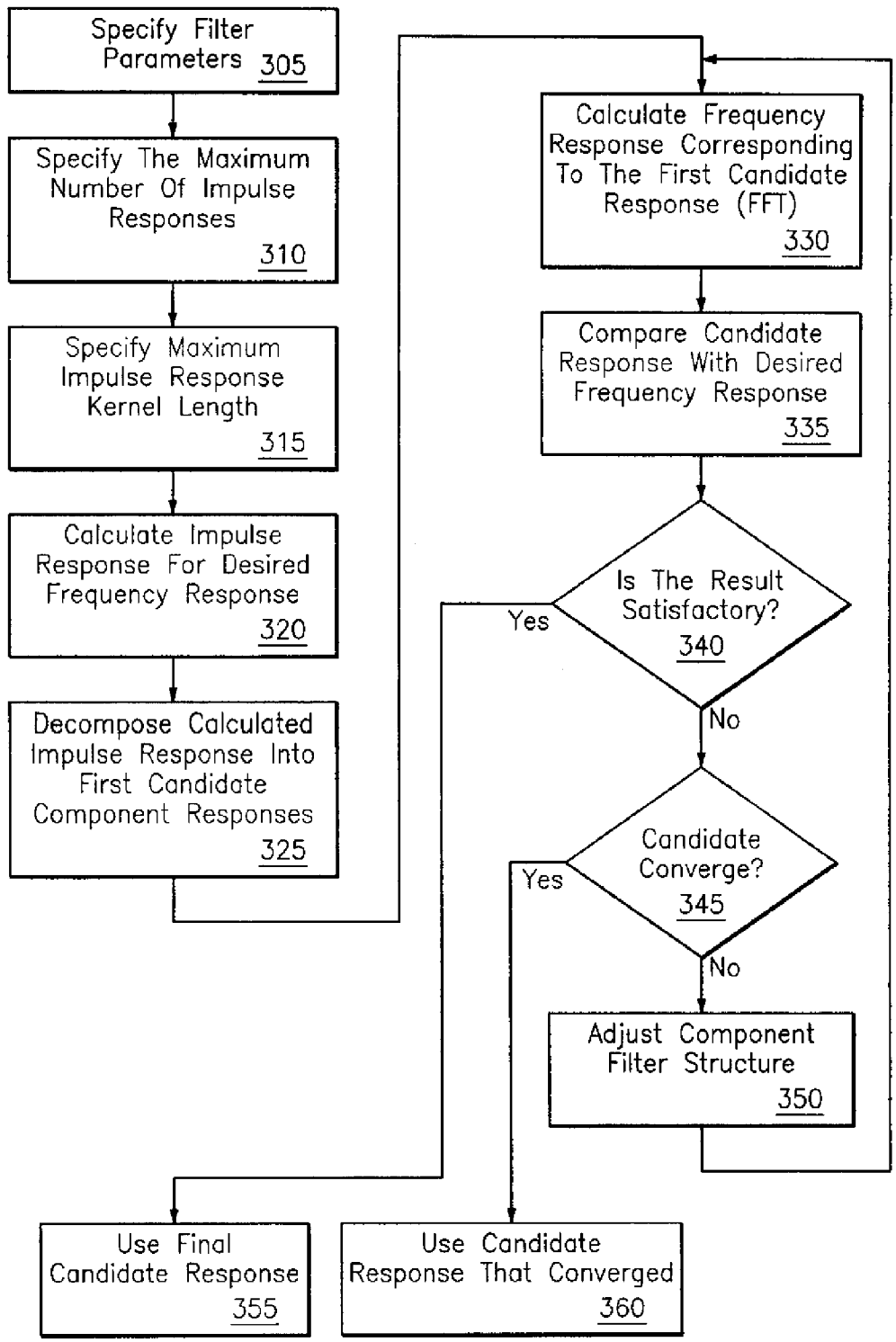
FIG. 3 is a block diagram of an exemplary impulse response decomposition method.

The invention performs an impulse decomposition method beginning with a desired filter frequency response as shown in FIG. 3. The filter frequency response is determined by an impulse response where the quantized impulse response and the filter coefficients are identical. The design consists of determining the impulse response from the desired frequency response and then quantizing the impulse response to generate the filter coefficients.

A user, or designer, specifies stop, passband, and stopband attenuation (dB) (step 305), and hardware constraints such as the maximum number of impulse responses (step 310) and the maximum kernel length (number of coefficients) of the desired filter (step 315). Given the desired frequency response, and the number of filter coefficients, a prototype impulse response may be designed using software specifically designed to calculate a filter impulse response (step 320). The impulse response is derived using software to perform a complex optimization process. One widely used program, MATLAB, from The MathWorks, may be used. After obtaining the calculated impulse response, the impulse response may be graphically decomposed into component rectangular impulse responses as in FIG. 2 (step 325) resulting in a first candidate decomposition.

A decomposition is not unique and the first candidate (step 325) may not produce satisfactory results. After decomposition, an iterative process may be used where the frequency response corresponding to the candidate impulse response decomposition is calculated (step 330) and compared with the initial frequency response specification (step 335).

If the frequency comparison result is not satisfactory (step 340), an iteration on the component structure may be performed. The decomposition is modified (step 350) by changing the widths of the rectangular component impulse responses by small amounts to produce a new candidate whose frequency response is calculated (step 330) and compared with the initial frequency response specification (step 335). If the comparison is acceptable (step 340), that candidate response is used (step 355).

For many filter frequency response specifications, when the derived maximum impulse response length and number of component impulse responses is small, the process converges (steps 345, 360) after a relatively small number of iterations. Further iterations may not lead to better results and may diverge from a best response.

If the final result is still not satisfactory, (steps 340, 345) two or more running sum FIR filters employing the same, or different rectangular components may be cascaded together, $$h = h_1 \otimes h_2 \Leftrightarrow H(\omega) = H_1(\omega) H_2(\omega). \tag{3}$$

Each of the cascaded filters may be designed as described above and may be further tuned by a similar iterative process with the difference that the frequency response of the cascaded FIR filters is now computed (step 330) after each iteration and compared to the initial specification. The optimization method usually results in two cascaded filters, each with different positions of the minima and maxima in the stopband of their frequency characteristics such that the stopband minima of one filter compensate the stopband maxima of the other. The compensation aspect allows the cascaded filter to exhibit uniformly good stopband attenuation.

The rectangular components may be considered to represent the impulse responses of individual component filters. The component filters and their rectangular impulse responses will be referred to by the symbols $h_1$, $h_2$, etc.

Figure 4:
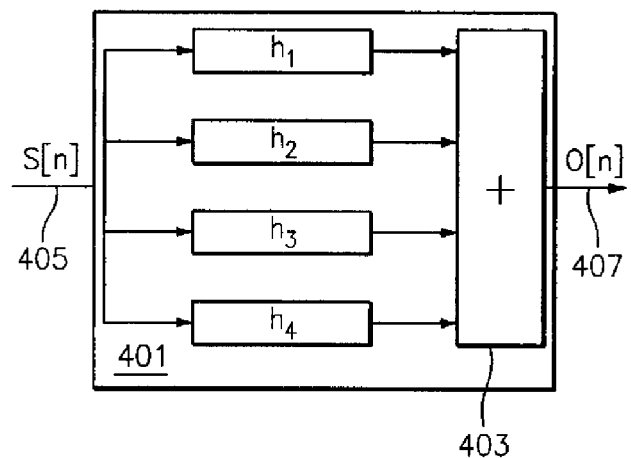
FIG. 4 is an exemplary system block diagram of a filter implemented as a sum of component rectangular filters.

Due to the linearity of convolution, the filter's response to the signal is equal to the sum of the responses of the component filters to the same signal, $$o[n] = s[n] \otimes h[n] = \sum_{i=1}^{I} s[n] \otimes h_i[n], \tag{4}$$

where i=1, 2, 3, . . . , I. Shown in FIG. 4 is a system 401 summing 403 the responses of individual component filters $h_1$, $h_2$, $h_3$, and $h_4$, (where I=4), convolved with the same signal s[n]. An input signal s[n] input 405 to the system 401 would be processed by each component filter $h_1$, $h_2$, $h_3$ and $h_4$, and then summed 403 together.

The component filter responses $h_1$, having values of 1 or −1 in their non-zero portion, may be implemented as the signed sums of signal samples over the non-zero portion of the impulse response thereby obviating multipliers.

Figure 5:
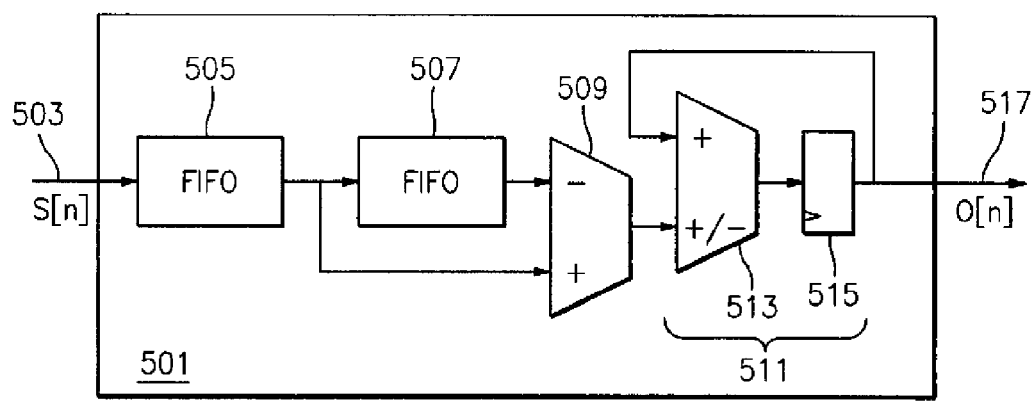
FIG. 5 is an exemplary system block diagram of a rectangular impulse response running sum filter.

Shown in FIG. 5 is an exemplary architecture of a recursive running sum filter configured for one predefined rectangular component response. The filter 501 includes a signal sample s[n] input 503, a first delay line such as a FIFO (first in, first out) 505, a second delay line 507, a first subtractor 509, an accumulator 511 comprising a second adder/subtractor 513 and a storage register 515, and a filter sample o[n] output 517. The filter 501 is a synchronous, pipelined architecture. The same clock (not shown) is used for both reading and writing data samples. To implement FIG. 4 would require four filters as shown in FIG. 5, each preconfigured with a rectangular component response $h_1$, $h_2$, $h_3$, and $h_4$.

A rectangular response is defined using the first 505 and second 507 delay lines. The first delay line 505 is preconfigured for the number of leading zero coefficients $d_i$ in a response. The second delay line 507 is preconfigured for the number of non-zero coefficients $D_i$ in a response.

The first delay line 505 provide the delay $d_i$ from the start of the impulse response to the first non-zero coefficient. For example, if the architecture shown in FIG. 5 was used to implement FIG. 4, each delay 505 would account for the leading number of zero coefficients for $h_1$, $h_2$, $h_3$, and $h_4$. For response $h_1$, $d_1$ equals 0 ($D_1$ equals 22). For response $h_2$, $d_2$ equals 6 ($D_2$ equals 10). For response $h_3$, $d_3$ equals 7 ($D_3$ equals 8). For response $h_4$, $d_4$ equals 8 ($D_4$ equals 6). The above values of $d_i$ time-aligns the responses of each filter $h_1$, $h_2$, $h_3$, and $h_4$ according to the decomposition shown in FIG. 2 and the following component filter relationship (the component index i has been omitted to simplify notation)

$$o[n+d+D] = \sum_{k=n+1}^{n+D} s[k] = \sum_{k=n}^{n+D-1} s[k] - s[n] + s[n+D]. \quad (5)$$

Prior to operation, the accumulator 511 register 515 and the first 505 and second 507 delay lines are initialized with 0's. The first delay line 505 provides the delay of d samples. During d input samples, the output of the first delay line 505 is 0. At input sample s[d−1], the output of the first delay line 505 is s[0], and so on, s[−1+1] is s[1], s[d−1+2] is s[2], ..., until the end of the input signal.

The recursive operation begins when a d delay 505 is over and the first input sample s[0] enters the second delay line 507 and subtractor 509. The subtractor 509 subtracts the output of the second delay line 507 (which at this point in time is 0) from the input sample. The first value s[0] is summed with 0 in adder/subtractor 513 and stored in register 515. The next series of samples, s[1 to D−1], are added together and stored 513.

The output of subtractor 507 is added, if the rectangular response is positive, or subtracted, if the rectangular response is negative, by the adder/subtractor 513 to/from the accumulator register 515 such that the output signal 517 becomes s[0] or −s[0]. The adder/subtractor 513 is controlled by a control signal (not shown) to perform addition or subtraction according to the sign (±) of the component impulse response.

After d+D samples are input, the output 517 of accumulator register 515 is the sum of samples (n=0 to D−1). When sample d+D becomes available at input 503, delayed sample, s[0], is available at the output of the second delay line 507. The subtractor 509 calculates the difference, s[D]−s[0], and adder/subtractor 513 adds this difference to the contents of the accumulator 515. The output 517 becomes a running sum of input samples convolved with a rectangular impulse response of length D. The operation continues with the output 517 being updated at each clock cycle to represent the sum of the last D input samples.

In most filtering applications, the input signal sampling frequency $f_s$ is typically lower than clock frequencies used within a filter. For example, in an ultrasound imaging application, a typical input signal sampling frequency $f_s$ may be 40 MHz, with each sample quantized to 12 bits. The filter itself may operate at multiples of the sampling frequency $f_s$, for example, at 160 MHz ($4f_s$). The higher clock rate allows the filter circuits to perform multiple operations between input signal samples, allowing multiple component rectangular filters to be calculated and summed by the same circuit. Multiple component filters may be implemented in a time-multiplexed fashion on the same circuit thus reducing the total size and cost of the filter.

Figure 6:
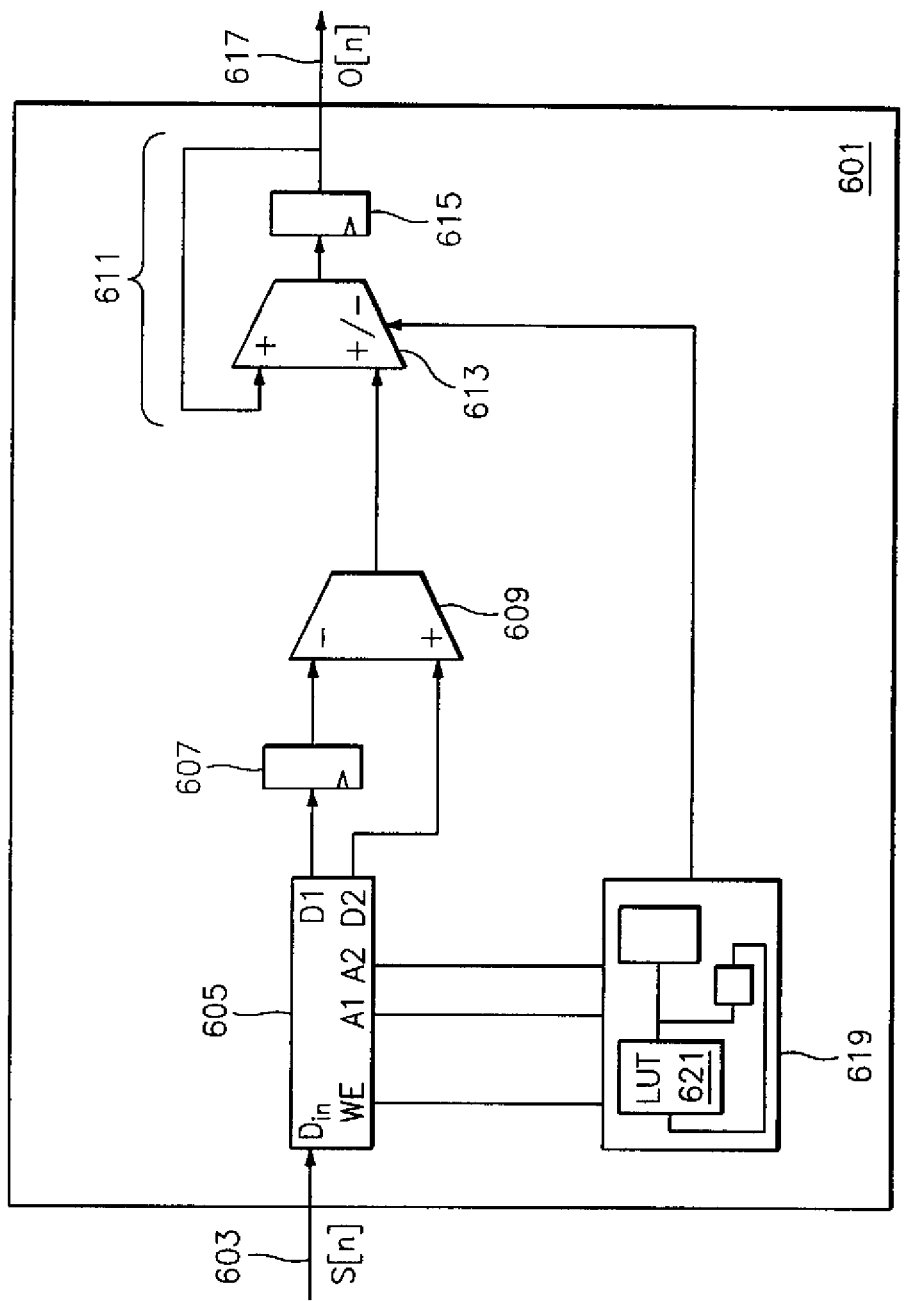
FIG. 6 is an exemplary system block diagram of a FIR filter using time-multiplexed multiple rectangular impulse response filters.

Shown in FIG. 6 is an embodiment of the FIR filter 601 of the invention. The filter 601 comprises a signal sample s[n] input 603, a multiple port memory 605, a first storage register 607, a first subtractor 609, an accumulator 611 comprising a second adder/subtractor 613 and a second storage register 615, and a filter sample output o[n] 617. A controller 619 controls the filter operation.

The circuit operates synchronously timed by a clock (not shown) $f_f$ which is phase-aligned with the input sample clock $f_s$. The clock has a frequency which is an integer multiple of the sampling frequency $If_s$ depending on the number I of component impulse responses employed.

The input data s[n] samples are coupled to a memory 605 input $D_{in}$. The memory 605 includes first A1 and second A2 address inputs, first D1 and second D2 data output buses, and a write enable WE. The first address input A1 selects a memory location from which data is read via output bus D1 and to which the input sample present at data input $D_{in}$ is written to when the write enable signal WE is asserted. The second address input A2 selects the memory location from which data is read via output bus D2.

The preferred type of multiple port memory 605 employed by the invention is available in FPGA (Field Programmable Gate Array) integrated circuits. Other memory configurations may be used. The memory 605 is configured as a circular buffer, having a length equal to the length of the component response having the longest duration. If a filter impulse response has M coefficients (where M=d+D+trailing zeros), the first input sample s[0] is written at address 0 of the memory 605, the second input sample s[1] at address 1, the $M^{th}$ sample $s[M^{th}]$ is written at address M−1.

After that, the write address is reset to 0 (hence the term "circular buffer") such that the $(M+1)^{th}$ input sample overwrites the (M+1) sample old data. Therefore at each sampling clock cycle after the first M, M samples of the input data are available in the memory 605.

During filter operation, an input sample s[n] may be written to any of the addresses c, where $0 \leq c \leq M-1$. A delayed sample s[n−D], when $D \leq M$, may be read from address $$a = c - D, \quad (6)$$

where $\alpha$ is the address being read from and c is the address being written to. If this results in a non-existing address condition where $\alpha < 0$, then according to the rules of circular buffer addressing, the address of a delayed sample becomes $$a = c - D + M. \quad (7)$$

When a location is addressed by the first address A1 for writing purposes, its contents is also read via the first output bus D1. The same clock edge which writes a new sample to the memory location selected by A1 also stores the old value read from that memory location into the first register 607 making it available to be subtracted from the accumulator register via subtractor 609 and adder/subtractor 613.

The controller 619 is coupled to the multiple port memory 605 and second adder/subtractor 613 of the accumulator 611. The filter controller 619 provides first A1 and second A2 data access addresses, the write enable signal WE, a sign control for the accumulator 611, and gating signals (not shown) used for initialization. In a preferred embodiment, the controller 619 is implemented by means of a look-up table (LUT) 621 in which the sequence of values for the first A1 and second A2 addresses, the write enable WE and accumulator 613 sign control are predefined before operation. In other embodiments, the LUT 621 may be self-addressed, that is the sequence of LUT addresses is also programmed in the same LUT 621. At the start of operation, the LUT address register is cleared, after which subsequent addresses are read from the LUT 621 itself. This operation simplifies the controller logic. The LUT may be a read-only memory (ROM) or a random access memory (RAM).

The output of the LUT may be registered to increase circuit speed, and in this case the circuit timing and sequence of data in the LUT must be appropriately adjusted. Likewise, a pipeline register (not shown) may be inserted between the output of the first adder 609 and the input to the accumulator 611. The pipeline register adds an extra clock delay between the first adder 609 and the accumulator 611, which requires the control signals' timing to be appropriately adjusted. These and other circuit modifications are known to one of ordinary skill in the art.

The filter 601 performs the function of a plurality of component filters as shown in FIG. 5 and employed in FIG. 4. The number of component filters $h_1, h_2, h_3, \ldots, h_I$ that may be implemented is equal to the ratio between the filter 601 clock rate $f_f$ and the input sample frequency $f_s$ as $$f_f = I f_s. \qquad (8)$$

For the filter 601, the outputs of each component filter employed are not separately calculated and summed. Instead, the sum of the outputs of the component filters is calculated in accumulator register 515.

For an example using two (I=2) component filters, $h_1$ and $h_2$, $$o[n+M] = \sum_{a=n+1}^{n+M} s[a] + \sum_{b=n+1+d}^{n+1+d+D-1} s[b], \qquad (9)$$

$$= \sum_{a=n}^{n+M-1} s[a] + \sum_{b=n+d}^{n+d+D-1} s[b] - s[n] + \qquad (10)$$

$$s[n+M] - s[n+d] + s[n+1+d+D-1],$$

where a, b and n are sample number indices. An explanation of the filter 601 for the case when a desired filter impulse response is decomposed into the sum of two component rectangular impulse responses $h_1$ and $h_2$, and the filter circuit clock frequency is doubled per (8) follows. Operation is similar for applications requiring more than two component impulse responses.

To create one filter response from two component responses $h_1$ and $h_2$, the filter clock frequency $f_f$ is double the input sample frequency $f_f = 2f_s$. Two filter clock cycles, subcycle 0 and subcycle 1 are defined within each sample clock cycle.

Since each component filter has M coefficients, the total impulse response of the filter 601 has M coefficients. One of the component filters, $h_1$ or $h_2$, has M non-zero coefficients defining its kernel length. The other component filter kernel may have the same number, or less than M non-zero coefficients, D. The component filter having D non-zero coefficients may have d zeros added before the non-zero portion defining the rectangular response and may have trailing zeros such that the total length of the component impulse response is M. The delay d before the non-zero coefficients may be greater than or equal to zero.

Prior to filter 601 operation, the accumulator 611 register 615 and memory 605 are initialized to 0. The controller 619 is also initialized such that it generates address 0 on the first address output A1.

Operation begins with input sampling clock cycle 0, with the arrival of sample s[0] at the filter input 603. In subcycle 0 of sampling cycle 0, the old sample of component filter $h_1$ is read from address 0 of memory 505 via data bus D1 (in the first M period cycles, the old value is 0 due to initialization). Controller 619 asserts a memory write enable signal WE. The clock leading edge of subcycle 1 stores the value from data bus D1 into register 607 and writes sample s[0] into address 0 of memory 605. During subcycle 1, controller 619 de-asserts the memory write enable WE and causes address A2 to take the value 0 causing sample s[0] to be read from address 0 of memory 605 to data bus D2, and to be forwarded to the input of accumulator register 615 via subtractor 609 and adder/subtractor 613. The total operation requires multiple subcycles, but since the operation is pipelined, a new operation is performed for each clock cycle.

The controller 619 asserts the sign control signal causing adder/subtractor 613 to perform addition or subtraction according to the sign of the non-zero coefficients of the first component filter k. At the same time, controller 619 asserts an address A1 which precedes address 0 by d+D, which according to the circular buffer addressing described above, results in the first address A1 equaling M–d–D and represents the address of the old sample of the second component filter $h_2$. The contents of address A1 is read via data bus D1.

During sampling clock $f_s$ cycle 1, sample s[1] becomes available at input 603. In subcycle 0 the contents of accumulator register 615 is updated and becomes s[0] and the old sample of component filter $h_2$ is stored in register 607. Controller 619 asserts memory write enable WE, address A1=1 (the location to which the new sample is to be written to and from which the old sample of component filter 1 is to be read from), Address A2 equals M–d (from which a new sample of component filter $h_2$ is read) and the sign control signal corresponding to the sign of component filter $h_2$. Subtractor 609 subtracts the old from the new sample of component filter 2, and adder/subtractor 613 adds or subtracts this difference to/from the contents of accumulator register 615 in accordance with the sign of component filter $h_2$ as determined by the sign control signal. The leading edge of subcycle 1 causes the first valid output sample o[0], sum of the outputs of first and second component filters, to be stored into accumulator register 615 and become available at output 617.

The operation proceeds in this manner until all the input samples s[n] have been processed. During each sampling cycle the controller 619 generates addresses A1 and A2, larger by 1 than the corresponding addresses generated in the previous sampling cycle, except that the addresses have a limited range of values according to the rules of circular buffer addressing. Namely, if during a sampling cycle an address reaches the value M−1 then in the following sampling cycle the corresponding address does not take value M but wraps around to value 0.

Figure 7:
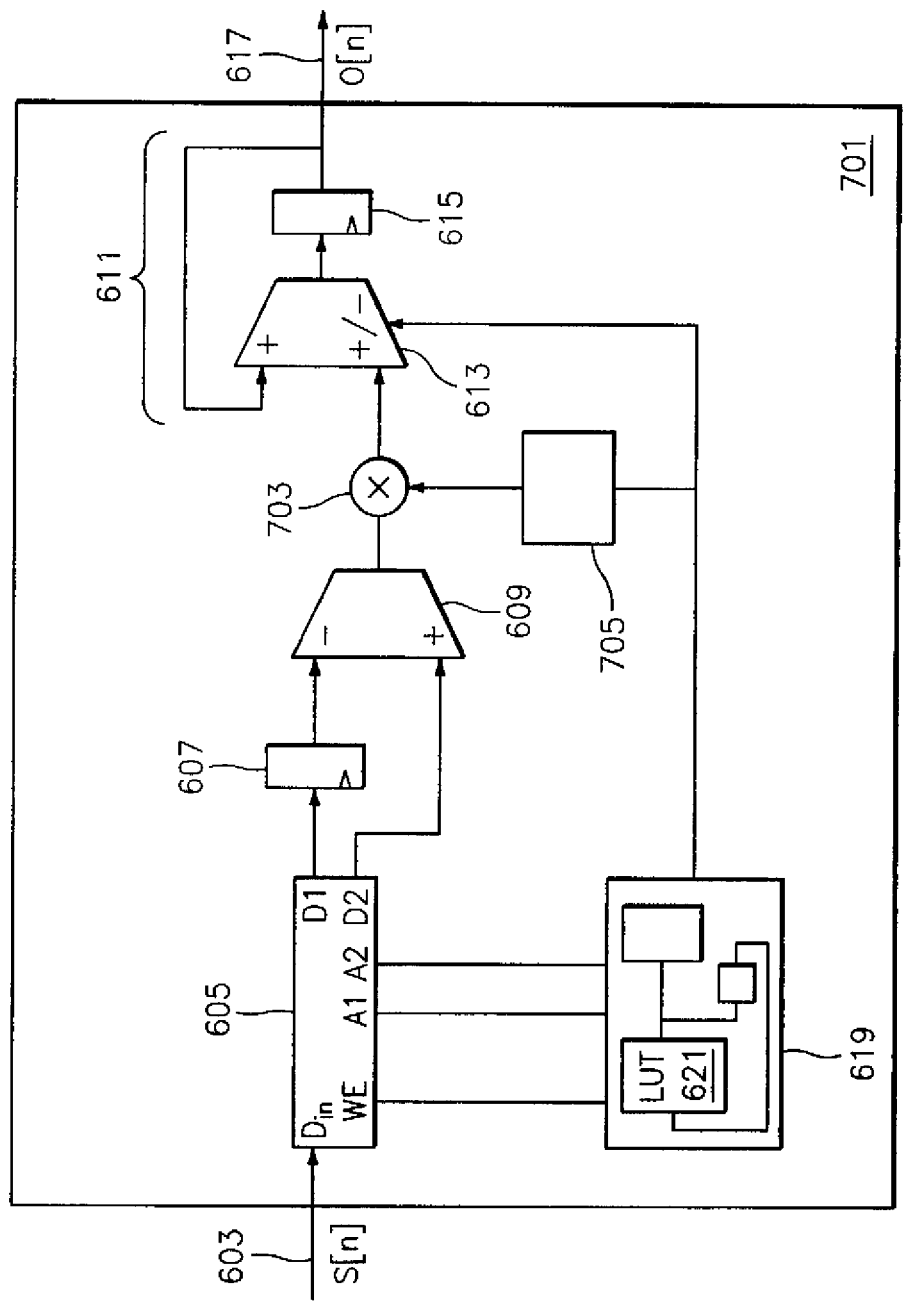
FIG. 7 is an exemplary alternative embodiment of the filter shown in FIG. 6 including a scaling multiplier.
Figure 8:
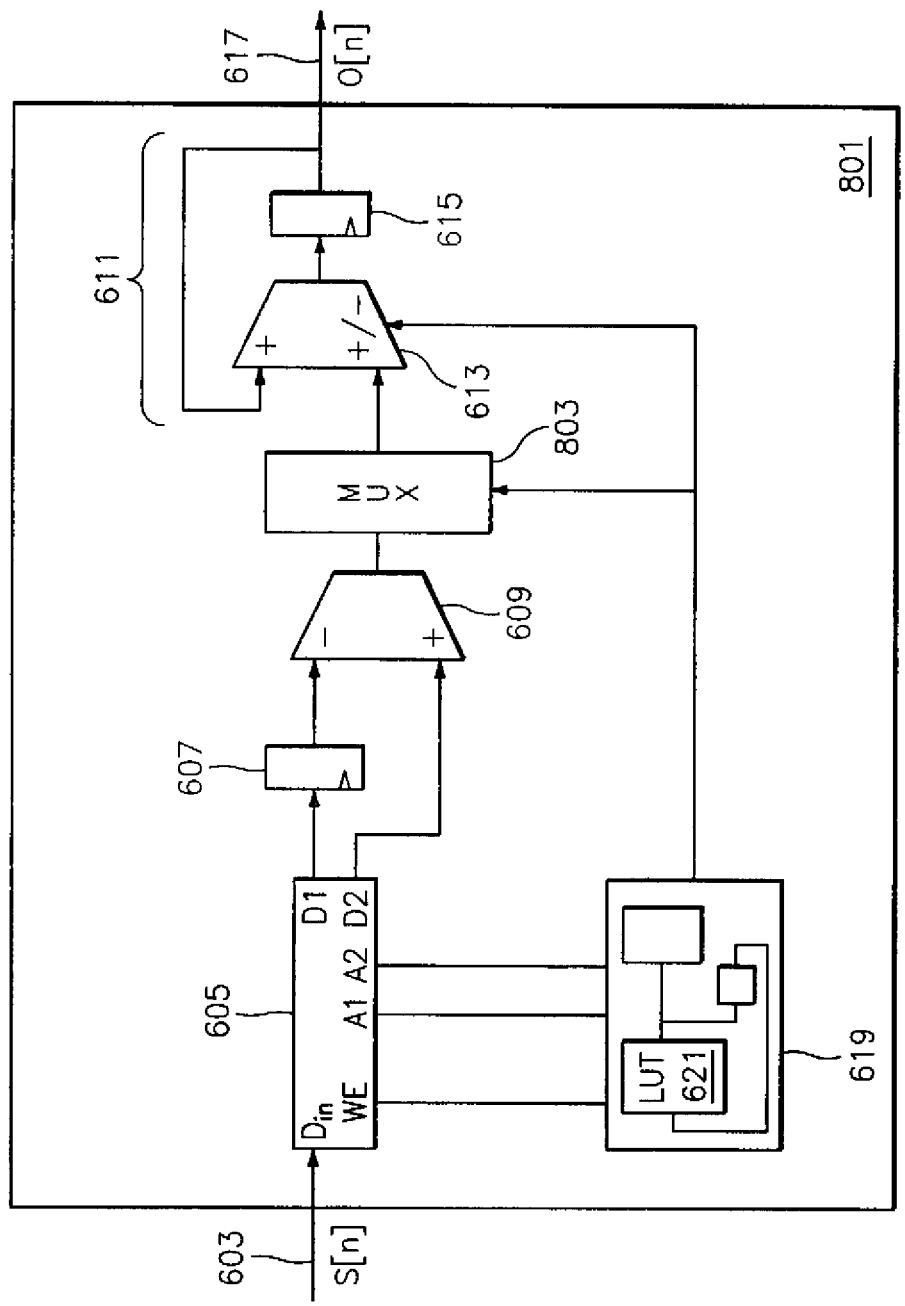
FIG. 8 is an exemplary alternative embodiment of the filter shown in FIG. 6 including a scaling multiplexer.

Alternative embodiments of the invention are shown in FIGS. 7 and 8. To improve on component filter accuracy, FIG. 7 adds a scaling multiplier 703 in conjunction with a coefficient store 705 between the subtractor 609 and accumulator 611. The scaling multiplier 703 multiplies an individual component filter value $h_i$ output from the subtractor 609 prior to accumulating using a respective coefficient from the store 705 as controlled by the controller 619 in the pipeline. The coefficients, or factors, for each component filter $h_i$ may be any scaling value and are assigned to respective component filters, for example, $h_1$ and $h_2$. Therefore component filters having amplitudes different than ±1 may be obtained, resulting in a better approximation of the desired impulse response.

The embodiment shown in FIG. 8 adds a scaling multiplexer 803 between the subtractor 609 and accumulator 611. The scaling multiplexer 803 scales an individual component filter value $h_i$ output from the subtractor 609 prior to accumulating by a power of 2, ($2^x$, where x=0, 1, 2, ...) as controlled by the controller 619 during pipeline operation. The 2' powers for each component filter $h_i$ are predefined scaling values assigned to a respective component filter ($h_1$ and $h_2$). Depending upon the predefined scaling value for a component filter, the multiplexer 803 shifts the binary value output by the subtractor 609 the predefined number of places towards the most significant bit (MSB) or the least significant bit (LSB), adding zeros if necessary. Moving a binary number one place (power) towards the MSB effectively multiplies the value by 2, the converse effectively divides the value by 2. The use of the multiplexer 803 may improve the impulse response approximation, but not to the resolution afforded by using a multiplier 703.

The invention may also be applied to 2-dimensional or higher-dimensional filters using the filter response decomposition method and implementation for the recursive calculation of multi-dimensional sums. 2-dimensional or multi-dimensional filtering is often used during image processing and is similar to 1-dimensional filtering. Filter response decompositions for multi-dimensional filters are not rectangular, but are parallelepiped or parallelepipedic components. The teachings of the invention may be extended to include multi-dimensional filter responses.

One or more embodiments of the present invention have been described. Nevertheless, it will be understood that various modifications may be made without departing from the spirit and scope of the invention. Accordingly, other embodiments are within the scope of the following claims.

What is claimed is:

1. A digital filter comprising:
   a filter input for inputting signal samples;
   a filter output for outputting a filtered sampled signal;
   a buffer coupled to the filter input, the buffer acting as a queue;
   a register having an input coupled to a first data output of the buffer;
   a subtractor having a minus input coupled to an output of the register and a plus input coupled to a second data output of the buffer for obtaining differences between a plurality of time-shifted signal samples and a second plurality of time-shifted signal samples output from the buffer, wherein each pair of samples of the first and second plurality of time-shifted samples output from the buffer represents a rectangular impulse response such that the incoming data sample is convolved with each of a plurality of rectangular impulse responses in time;
   an accumulator input coupled to an output of the subtractor for keeping a running sum of the plurality of differences, and an output coupled to the filter output; and
   a controller coupled to the buffer and accumulator, the controller configured to rotate through the buffer for addresses where a next incoming signal sample will be written to and where a previously written signal sample will be read from, and controls whether a difference is added to or subtracted from the running sum.

2. The filter according to claim 1 wherein the accumulator further comprises:
   an adder/subtractor having a first input as the accumulator input; and
   a register having an input coupled to an output of the adder/subtractor and an output coupled to a second input of the adder/subtractor and the filter output.

3. The filter according to claim 2 wherein the filter clock rate is determined by the number of rectangular impulse responses employed by the filter multiplied by the filter input signal sample rate.

4. The filter according to claim 3 wherein the filter input signal samples and filtered output signal samples are synchronous and at the same clock rate.

5. The filter according to claim 4 wherein the buffer is a circular buffer.

6. A digital filter comprising:
   a filter input for inputting signal samples;
   a filter output for outputting a filtered sampled signal;
   a buffer coupled to the filter input, the buffer acting as a queue;
   a register having an input coupled to a first data output of the buffer;
   a subtractor having a minus input coupled to an output of the register and a plus input coupled to a second data output of the buffer for obtaining differences between a plurality of time-shifted signal samples and a second plurality of time-shifted signal samples output from the buffer, wherein each pair of samples of the first and second plurality of time-shifted samples output from the buffer represents a rectangular impulse response such that the incoming data sample is convolved with each of a plurality of rectangular impulse responses in time;
   a multiplier having an input coupled to an output of the subtractor and a coefficient input coupled to a coefficient store, the multiplier configured to multiply a predetermined coefficient with a difference output by the subtractor as a scaled difference;
   an accumulator input coupled to an output of the multiplier for keeping a running sum of the plurality of differences, and an output coupled to the filter output; and
   a controller coupled to the buffer and accumulator, the controller configured to rotate through the buffer for addresses where a next incoming signal sample will be written to and where a previously written signal sample will be read from, and controls whether a difference is added to or subtracted from the running sum and chooses a coefficient from the coefficient store for multiplying with a difference if a difference requires scaling.

7. The filter according to claim 6 wherein the accumulator further comprises:
   an adder/subtractor having a first input as the accumulator input; and
   a register having an input coupled to an output of the adder/subtractor and an output coupled to a second input of the adder/subtractor and the filter output.

8. The filter according to claim 7 wherein the filter clock rate is determined by the number of rectangular impulse responses employed by the filter multiplied by the filter input signal sample rate.

9. The filter according to claim 8 wherein the filter input signal samples and filtered output signal samples are synchronous and at the same clock rate.

10. The filter according to claim 9 wherein the buffer is a circular buffer.

11. A digital filter comprising:
    a filter input for inputting signal samples;
    a filter output for outputting a filtered sampled signal;
    a buffer coupled to the filter input, the buffer acting as a queue;
    a register having an input coupled to a first data output of the buffer;
    a subtractor having a minus input coupled to an output of the register and a plus input coupled to a second data output of the buffer for obtaining differences between a plurality of time-shifted signal samples and a second plurality of time-shifted signal samples output from the buffer, wherein each pair of samples of the first and second plurality of time-shifted samples output from the buffer represents a rectangular impulse response such that the incoming data sample is convolved with each of a plurality of rectangular impulse responses in time;

a multiplexer having an input coupled to an output of the subtractor, the multiplier configured to shift a difference output by the subtractor by a predetermined power of two as a scaled difference;

an accumulator input coupled to an output of the multiplexer for keeping a running sum of the plurality of differences, and an output coupled to the filter output; and a controller coupled to the buffer and accumulator, the controller configured to rotate through the buffer for addresses where a next incoming signal sample will be written to and where a previously written signal sample will be read from, and controls whether a difference is added to or subtracted from the running sum and chooses a power of two from the multiplexer for multiplying with a difference if a difference requires scaling.

12. The filter according to claim 11 wherein the accumulator further comprises:

an adder/subtractor having a first input as the accumulator input; and a register having an input coupled to an output of the adder/subtractor and an output coupled to a second input of the adder/subtractor and the filter output.

13. The filter according to claim 12 wherein the filter clock rate is determined by the number of rectangular impulse responses employed by the filter multiplied by the filter input signal sample rate.

14. The filter according to claim 13 wherein the filter input signal samples and filtered output signal samples are synchronous and at the same clock rate.

15. The filter according to claim 14 wherein the buffer is a circular buffer.

* * * * *